United States Patent
Inoue

(10) Patent No.: US 6,861,654 B2
(45) Date of Patent: Mar. 1, 2005

(54) CUTTING DEVICE

(75) Inventor: Takaaki Inoue, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 10/468,349

(22) PCT Filed: Dec. 27, 2002

(86) PCT No.: PCT/JP02/13763
§ 371 (c)(1),
(2), (4) Date: Aug. 18, 2003

(87) PCT Pub. No.: WO03/060971
PCT Pub. Date: Jul. 24, 2003

(65) Prior Publication Data
US 2004/0065851 A1 Apr. 8, 2004

(30) Foreign Application Priority Data
Jan. 10, 2002 (JP) ........................................ 2002-003450

(51) Int. Cl.[7] .................. G01N 21/00; G01N 23/00
(52) U.S. Cl. .................. 250/455.11; 250/453.11; 250/454.11; 438/464
(58) Field of Search ................ 250/453.11, 454.11, 250/455.11; 438/464

(56) References Cited
U.S. PATENT DOCUMENTS 5,332,406 A * 7/1994 Takeuchi et al. ............. 225/25

FOREIGN PATENT DOCUMENTS

| JP | 62-189113 | 8/1987 |
|----|-----------|--------|
| JP | 9-266182 | 10/1997 |
| JP | 2002-299286 | 10/2002 |

* cited by examiner

Primary Examiner—John R. Lee
Assistant Examiner—Paul M. Gurzo
(74) Attorney, Agent, or Firm—Smith, Gambrell & Russell

(57) ABSTRACT

A cutting machine equipped with a cassette placing unit having a cassette table for placing a cassette storing a workpiece supported to an annular support frame via an adhesive tape. The cassette placing unit comprises an ultraviolet light irradiation unit which is disposed below the cassette table, stores a workpiece supported to the support frame by the adhesive tape and irradiates the adhesive tape with ultraviolet rays and an ascending and descending mechanism which positions the cassette placed on the cassette table at a first workpiece carrying-in/carrying-out position which is located in the carrying-in/carrying-out area for the workpiece carrying-in/carrying-out means and the ultraviolet light irradiation unit at a second workpiece carrying-in/carrying-out position which is located in the carrying-in/carrying-out area for the workpiece carrying-in/carrying-out means.

2 Claims, 3 Drawing Sheets

CUTTING DEVICE

TECHNICAL FIELD

The present invention relates to a cutting machine for cutting a workpiece such as a semiconductor wafer, adhered to an adhesive tape which is affixed to an annular support frame in such a manner that it covers the inside opening of the support frame.

BACKGROUND ART

In the production process of semiconductor devices, for example, semiconductor chips are produced by forming a circuit such as IC, LSI or the like in a plurality of areas arranged in a lattice form on the surface of a substantially disk-like semiconductor wafer and dicing the areas having the circuit formed along predetermined streets (cutting lines) with a cutting machine. When the semiconductor wafer is thus diced with a cutting machine, it is supported to a frame by an adhesive tape so that divided semiconductor chips are not separated from one another. The support frame is formed in an annular form, and has an opening for storing the semiconductor wafer and a tape-affixing portion to which the tape is affixed, and the semiconductor wafer is adhered to the tape that is situated at the opening. Thus, a plurality of semiconductor chips obtained by dividing the semiconductor water supported to the support frame by the adhesive tape are carried to the subsequent die bonding step in a state of being supported to the support frame by the adhesive tape, picked up from the adhesive tape by a die bonder one by one and mounted to a predetermined position of a lead frame or package.

To facilitate the pick-up work of the semiconductor chips by the die bonder, a so-called UV tape whose adhesive force is reduced by exposure to ultraviolet radiation is generally used as the adhesive tape. After the semiconductor wafer is divided into a plurality of semiconductor chips, the adhesive tape is exposed to ultraviolet radiation. Therefore, when a so-called UV tape is used as the adhesive tape for supporting the semiconductor wafer to the frame, a UV exposure step is required after the step of dicing by a cutting machine, thereby reducing productivity.

To solve the above problem, the present applicant proposed a cutting machine provided with an ultraviolet light irradiation unit so that while the next semiconductor wafer is being diced, the diced semiconductor wafer is carried to an ultraviolet light irradiation unit in order to irradiate a so-called UV tape affixed to the diced semiconductor wafer with ultraviolet radiation.

Thus, to provide the cutting machine with the ultraviolet light irradiation unit, an installation space is needed, which is the cause of impeding a downsizing of the cutting machine. The cutting machine provided with an ultraviolet light irradiation unit requires a conveyance means for carrying the diced semiconductor wafer to the ultraviolet light irradiation unit, thereby making the whole structure of the apparatus complex and boosting its cost.

The present invention has been made in the light of the above fact, and the technical object of the present invention is to provide a cutting machine which enables it to be reduced in size and can have an ultraviolet light irradiation unit without addition of a conveyance means.

DISCLOSURE OF THE INVENTION

To attain the above principal technical object, according to the present invention, there is provided a cutting machine which is equipped with a cassette placing unit having a cassette table for placing a cassette storing a workpiece supported to an annular support frame by an adhesive tape, a workpiece carrying-in/carrying-out means for carrying out a workpiece stored in the cassette placed on the cassette table and carrying a workpiece into the cassette, and a cutting means for cutting a workpiece carried out by the workpiece carrying-in/carrying-out means, wherein the cassette placing unit comprises an ultraviolet light irradiation unit, arranged below the cassette table, for storing a workpiece supported to the support frame by the adhesive tape and irradiating the adhesive tape with ultraviolet radiation and an ascending/descending mechanism for positioning the cassette placed on the cassette table at a first workpiece carrying-in/carrying-out position which is located in the carrying-in/carrying-out area for the workpiece carrying-in/carrying-out means and the ultraviolet light irradiation unit at a second workpiece carrying-in/carrying-out position which is located in the carrying-in/carrying-out area for workpiece carrying-in/carrying-out means.

The above cassette table forms the top wall of the housing of the above ultraviolet light irradiation unit.

BEST MODE FOR CARRYING OUT THE INVENTION

A preferred embodiment of a cutting machine constituted according to the present invention will be described in detail with reference to the accompanying drawings.

Figure 1:
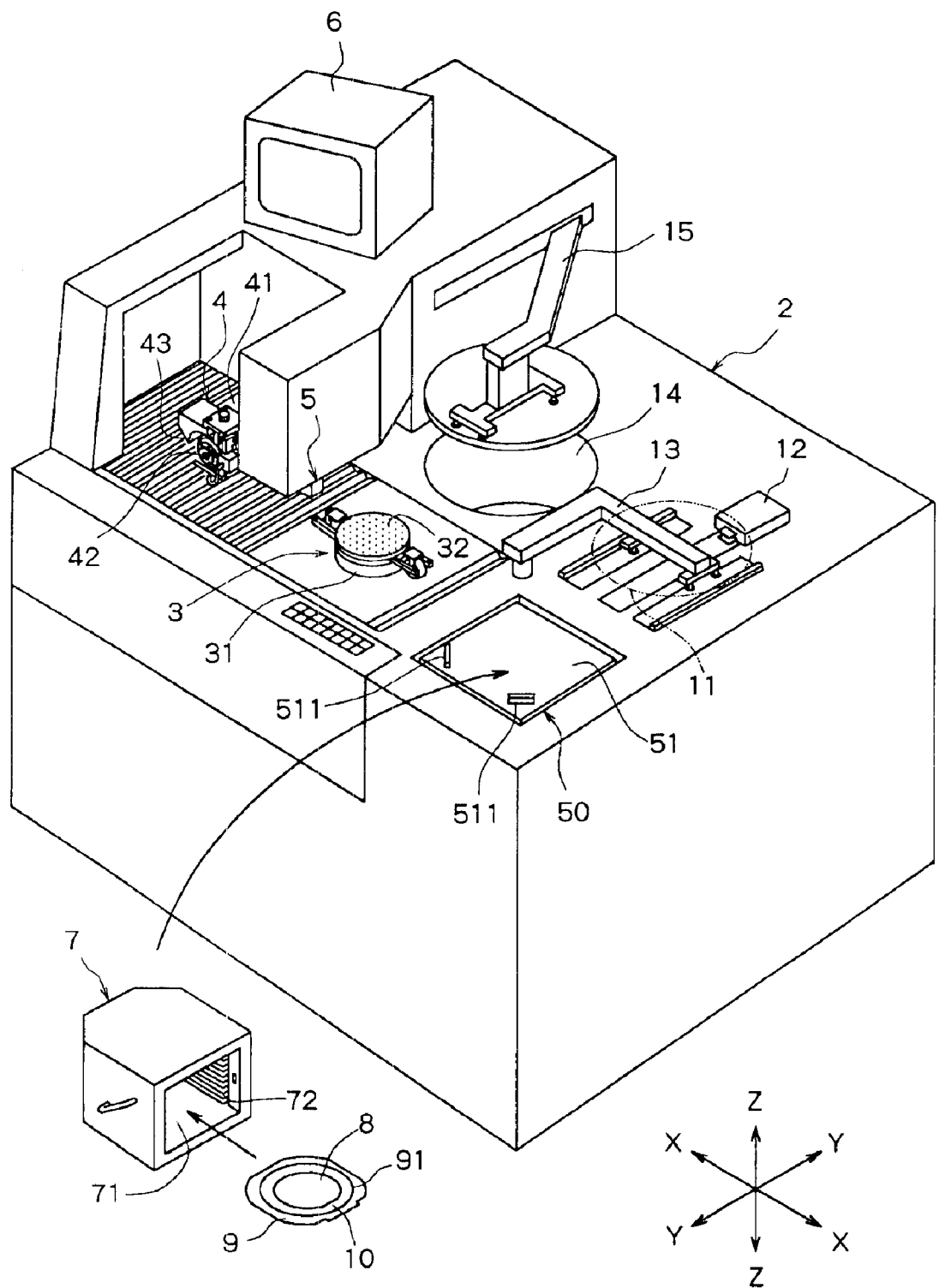
FIG. 1 is a perspective view of a cutting machine constituted according to the present invention.

FIG. 1 is a perspective view of a cutting machine constituted according to the present invention.

The cutting machine of the illustrated embodiment comprises a substantially rectangular parallelepiped machine housing 2. In the housing 2, there is disposed a chuck table 3 for holding a workpiece, which can move in a direction shown by an arrow X that is a cutting feed direction. The chuck table 3 comprises an adsorption chuck support base 31 and an adsorption chuck 32 mounted on the adsorption chuck support base 31. The workpiece, for example, a disk-like semiconductor wafer is held on the placing surface which is the surface of the adsorption chuck 32, by a suction means that is not shown. The chuck table 3 is turnably constituted by a rotation mechanism that is not shown.

The cutting machine of the illustrated embodiment has a spindle unit 4 as a cutting means. The spindle unit 4 comprises a spindle housing 41 which is mounted on a movable base (not shown) to be moved in a direction shown by an arrow Y which is an indexing direction and in a direction shown by an arrow Z which is a cutting direction, a rotary spindle 42 which is rotatably supported to the spindle housing 41 and is rotatingly driven by a rotary drive unit (not shown), and a cutting blade 43 which is mounted to the rotary spindle 42.

The cutting machine of the illustrated embodiment has an imaging unit 5 which images the surface of the workpiece held on the surface of the adsorption chuck 32 constituting the above chuck table 3 to detect the area to be cut with the above cutting blade 43 or confirm the state of a cut groove. This imaging unit 5 is an optical means such as a microscope or CCD camera. The dicing machine is furnished with a display means 6 for displaying an image imaged by the imaging unit 5.

The cutting machine of the illustrated embodiment has a cassette 7 for storing a semiconductor wafer 8 as the workpiece. The semiconductor wafer 8 is adhered to an adhesive tape 10 affixed to a support frame 9 formed in an annular form and made of a metal material such as stainless steel or the like, in such a manner that it covers the inside opening 91 of the support frame 9. As the adhesive tape 10 is used a so-called UV tape whose adhesive force is reduced by being exposed to ultraviolet radiation. The above cassette 7 has, in one end portion thereof, a carrying-in/carrying-out opening 71 for carrying in and out the semiconductor wafer 8 supported to the support frame 9 by the adhesive tape 10 (the semiconductor wafer 8 which is supported to the support frame 9 by the adhesive tape 10 will be simply referred to as "semiconductor wafer" hereinafter), and a plurality of racks 72 for placing semiconductor wafers arranged in a vertical direction are provided in the inside thereof. The cassette 7 for storing the semiconductor wafers 8 is placed on the cassette table 51 of the cassette placing unit 50 in such a manner that the carrying-in/carrying-out opening 71 faces a workpiece placing area 11. The cassette placing unit 50 will be described in detail hereinafter.

The cutting machine of the illustrated embodiment comprises a workpiece carrying-in/carrying-out means 12 which carries the semiconductor wafer 8 as a workpiece stored in the cassette 7 out to the workpiece placing area 11 and also carries the cut semiconductor wafer 8 into the cassette 7; a workpiece conveying means 13 which carries the semiconductor wafer 8 carried out by the workpiece carrying-in/carrying-out means 12 onto the above chuck table 3; a cleaning means 14 for cleaning the semiconductor wafer 8 cut on the chuck table 3 and a conveyance means for cleaning 15 for carrying the semiconductor wafer 8 cut on the chuck table 3 to the cleaning means 14.

A description will be subsequently given of the above cassette placing unit 50 with reference to FIG. 2 and FIG. 3. The cassette placing unit 50 comprises a cassette table 51 for placing the cassette 7, an ultraviolet light irradiation unit 52, disposed below the cassette table 51, for storing the semiconductor wafer 8 as a workpiece supported to the support frame 9 by the adhesive tape 10 and irradiating the adhesive tape 10 with ultraviolet radiation, and an ascending/descending mechanism 53 for ascending and descending the cassette table 51 and the ultraviolet light irradiation unit 52. In the illustrated embodiment, the cassette table 51 and a housing 521 for the ultraviolet light irradiation unit 52 are constituted integratedly. That is, the cassette table 51 serves as the top wall of the housing 521. On top of the cassette table 51, there is provided a positioning member 511 for positioning the above cassette 7 when it is placed as shown in FIG. 1. The housing 521 whose top wall is the cassette table 51 has an carrying-in/carrying-out opening 521a for carrying in and out the semiconductor wafer 8 in one end portion (end portion on the workpiece placing area 11 side in FIG. 1) and shelves 521c and 521c for placing the semiconductor wafer on the inner surfaces of the side walls 521b and 521b that face each other. A plurality of ultraviolet light irradiation lamps 522 are provided below the shelves 521c and 521c in the housing 521. The thus constituted ultraviolet light irradiation unit 52 is fixed on a support base 54 so that the housing 521 is ascended and descended by the ascending/descending mechanism 53 which will be described hereinafter.

Figure 2:
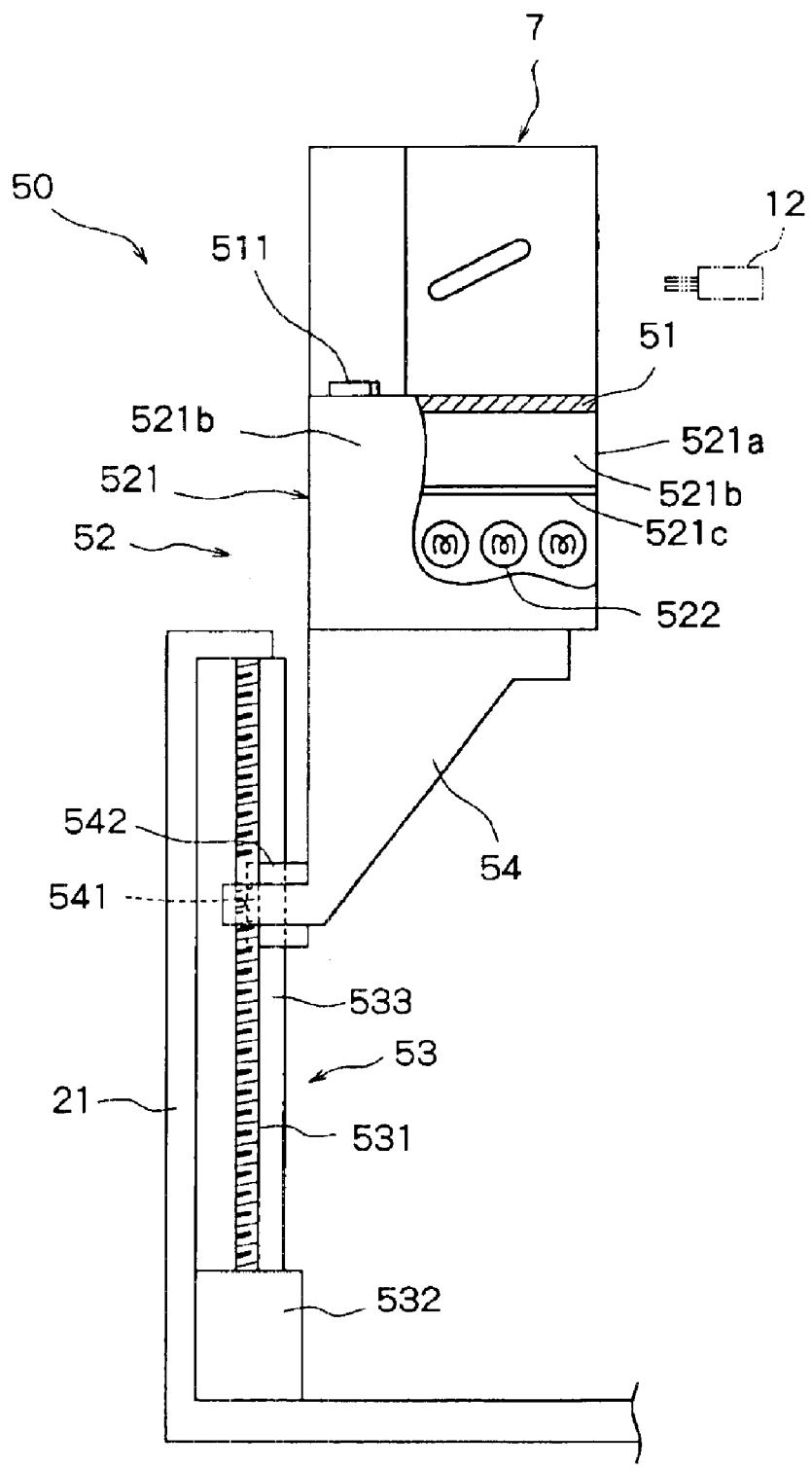
FIG. 2 is a partially broken side view of a cassette placing unit mounted to the cutting machine shown in FIG. 1.
Figure 3:
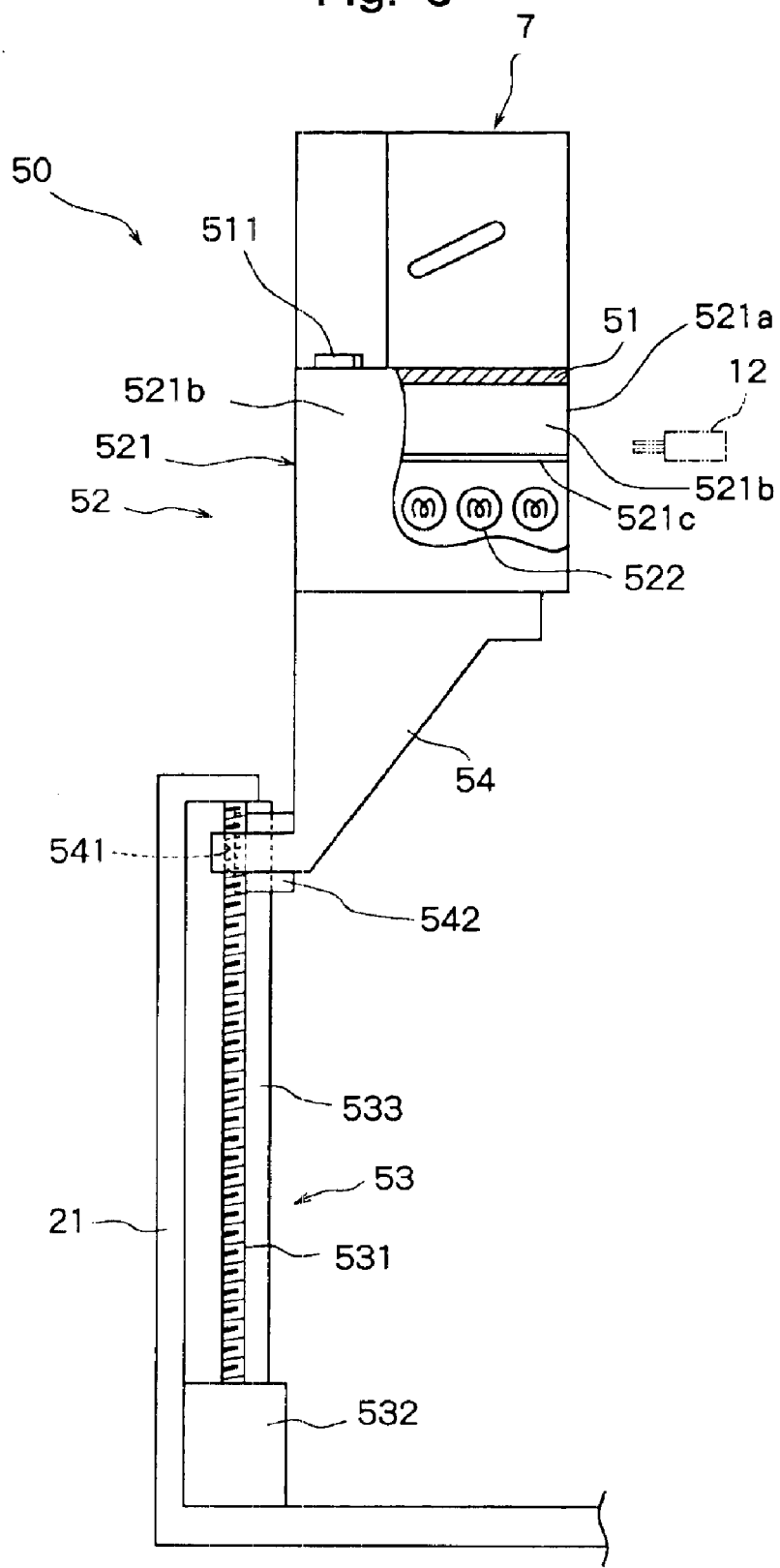
FIG. 3 is a side view showing the operation state of the cassette placing unit shown in FIG. 2.

As shown in FIG. 2 and FIG. 3, the above ascending/descending mechanism 53 comprises a male screw rod 531 which is rotatably supported in a vertical direction along the side wall 21 of the housing 2, a pulse motor 532 which can run in a normal direction and reverse direction to turn the above male screw rod 531, and guide rails 533 which are provided on both sides of the above male screw rod 531 in parallel to each other and extend in a vertical direction. A female screw hole 541 formed in one end portion of the above support base 54 is meshed with the male screw rod 531, and guided rails 542 are mated with the guide rail 533. Therefore, when the pulse motor 532 is rotatingly driven in one direction, the support base 54 is moved up along the male screw rod 531 and the guide rails 533 and when the pulse motor 532 is rotatingly driven in the other direction, the support base 54 is moved down along the male screw rod 531 and the guide rails 533. The support base 54 which is thus moved vertically is positioned at a first workpiece carrying-in/carrying-out position where the cassette 7 placed on the cassette table 51 is caused to locate in the carrying-in/carrying-out area for the workpiece carrying-in/carrying-out means 12 as shown in FIG. 2 and at a second workpiece carrying-in/carrying-out position where the ultraviolet light irradiation unit 52 is caused to locate in the carrying-in/carrying-out area for the workpiece carrying-in/carrying-out means 12 as shown in FIG. 3. At the first workpiece carrying-in/carrying-out position, the position of the ascending/descending mechanism 53 is adjusted according to the storage position of the semiconductor wafer 8 as the workpiece stored in the cassette 7 placed on the cassette table 51.

The cutting machine of the illustrated embodiment is constituted as described above and its function will be described hereinbelow.

To subject the semiconductor wafer 8 to dicing, the cassette 7 storing the semiconductor wafer 8 is placed at a predetermined position on the cassette table 51 of the cassette placing unit 50. To place the cassette 7 on the cassette table 51, the cassette table 51 is positioned at the first workpiece carrying-in/carrying-out position as shown in FIG. 2. As shown in FIG. 2, when the cassette 7 has been placed at the predetermined position on the cassette table 51 at the first workpiece carrying-in/carrying-out position, the preparation of the dicing work of the semiconductor wafer 8 stored in the cassette 7 is completed.

A description is continued with reference to FIG. 1. When the preparation of the dicing work has been completed as described above and an instruction to start the cutting work is issued, the workpiece carrying-in/carrying-out means 12 advances and retreats to carry out the semiconductor wafer 8 stored at a predetermined position of the cassette 7 to the workpiece placing area 11. The semiconductor wafer 8 carried out to the workpiece placing area 11 is carried to the placing surface of the adsorption chuck 32 constituting the above chuck table 3 by the turning of the workpiece conveying means 13 and suction-held on the adsorption chuck 32. Thus, the chuck table 3 suction-holding the semiconductor wafer 8 is moved right below the imaging unit 5. When the chuck table 3 is situated right below the imaging unit 5, streets (cutting lines) formed in the semiconductor wafer 8 are detected by the imaging unit 5 and the precision aligning work is carried out by adjusting the movement of the spindle unit 4 in the direction shown by the arrow Y, which is the indexing direction.

Thereafter, the chuck table 3 suction-holding the semiconductor wafer 8 is moved in the direction shown by the arrow X (direction perpendicular to the rotary shaft of the cutting blade 43) which is the cutting feed direction, to cut the semiconductor wafer 8 held on the chuck table along a predetermined street (cutting line) with the cutting blade 43. That is, since the cutting blade 43 is mounted to the spindle unit 4 which is moved in the direction shown by the arrow Y which is the indexing direction and the direction shown by the arrow Z which is the cutting direction to be positioned and rotatingly driven to be turned, the semiconductor wafer 8 held on the chuck table 3 is cut along the predetermined street (cutting line) with the cutting blade 43 by moving the chuck table 3 in the cutting feed direction shown by the arrow X below the cutting blade 43. The semiconductor wafer 8 is thus cut along the streets (cutting lines) to be divided into semiconductor chips. The divided semiconductor chips are not separated from one another by the function of the adhesive tape 10 and the state of the semiconductor wafer 8 supported to the frame 9 is maintained. After the cutting of the semiconductor wafer 8 is thus completed, the semiconductor chips divided and supported to the frame 9 by the adhesive tape 10 (to be referred to as "semiconductor wafer 8 after dicing" hereinafter) are returned to a position where the semiconductor wafer 8 was first suction-held and then, the semiconductor wafer 8 after dicing is released from the suction-holding. Thereafter, the semiconductor wafer 8 after dicing is carried to the cleaning means 14 by the conveyance means for cleaning 15 in order to remove contaminants produced at the time of cutting by cleaning. The thus cleaned semiconductor wafer 8 after dicing is carried to the workpiece placing area 11 by the workpiece conveying means 13.

Meanwhile, the cassette placing unit 50 activates the ascending/descending mechanism 53 during the above cutting work to position the ultraviolet light irradiation unit 52 at the second workpiece carrying-in/carrying-out position which is located in the carrying-in/carrying-out area for the workpiece carrying-in/carrying-out means 12 as shown in FIG. 3. The semiconductor wafer 8 after dicing which has been carried to the workpiece placing area 11 as described above by activating the workpiece carrying-in/carrying-out means 12 is carried on shelves 521c and 521c in the housing 521 of the ultraviolet light irradiation unit 52 positioned at the second workpiece carrying-in/carrying-out means 12. After the semiconductor wafer 8 after dicing is thus carried into the ultraviolet light irradiation unit 52, the cassette placing unit 50 activates the ascending/descending mechanism 53 to position the cassette 7 placed on the cassette table 51 at the first workpiece carrying-in/carrying-out position which is located in the carrying-in/carrying-out area for the workpiece carrying-in/carrying-out means 12 as shown in FIG. 2. Then, the above-described cutting work is carried out on the semiconductor wafer 8 to be diced next. During this cutting work, the ultraviolet light irradiation unit 52 turns on the ultraviolet light irradiation lamps 522 for a predetermined time to irradiate the adhesive tape 10 for adhering the semiconductor wafer 8 after dicing placed on the shelves 521c and 521c in the housing 521, with ultraviolet radiation. As a result, the adhesive force of the adhesive tape 10 for adhering the divided semiconductor chips is reduced.

After the adhesive tape 10 for adhering the semiconductor wafer 8 after dicing carried into the ultraviolet light irradiation unit 52 is exposed to ultraviolet radiation as described above, the cassette placing unit 50 activates the ascending/descending mechanism 53 to position the ultraviolet light irradiation unit 52 at the second workpiece carrying-in/carrying-out position as shown in FIG. 3. Then, the workpiece carrying-in/carrying-out means 12 is activated to carry out the semiconductor wafer 8 after dicing, which has been exposed to ultraviolet radiation in the ultraviolet light irradiation unit 52. The ascending/descending mechanism 53 of the cassette placing unit 50 is activated to position the cassette 7 at the first workpiece carrying-in/carrying-out position shown in FIG. 2 and then the workpiece carrying-in/carrying-out means 12 is activated again to store the semiconductor wafer 8 after dicing, which has been exposed to ultraviolet radiation, at a predetermined position of the cassette 7 situated at the first workpiece carrying-in/carrying-out position. The cutting step and the ultraviolet light irradiation step are thus carried out on the semiconductor wafer 8 stored in the cassette 7.

As described above, since the cassette placing unit 50 has the ultraviolet light irradiation unit 52 below the cassette table 51 in the cutting machine of the illustrated embodiment, an area for installing the ultraviolet light irradiation unit is not especially needed. Accordingly, the ultraviolet light irradiation unit 52 can be equipped without increasing the size of the whole apparatus. Further, since the cassette placing unit 50 has the ascending/descending mechanism 53 for positioning the cassette 7 placed on the cassette table 51 at the first workpiece carrying-in/carrying-out position (position shown in FIG. 2) which is located in the carrying-in/carrying-out area for the workpiece carrying-in/carrying-out means 12 and the ultraviolet light irradiation unit 52 at the second workpiece carrying-in/carrying-out position (position shown in FIG. 3) which is located in the carrying-in/carrying-out area for the workpiece carrying-in/carrying-out means 12, it is possible to use the workpiece carrying-in/carrying-out means 12 for carrying out the semiconductor wafer 8 stored in the cassette 7 to the workpiece placing area 11 and carrying the semiconductor wafer 8 after dicing into the cassette 7 as a carrying-in/carrying-out means for carrying in and out the semiconductor wafer 8 after dicing to and from the ultraviolet light irradiation unit 52. Therefore, there is no need of providing a conveyance means for carrying the semiconductor wafer 8 after dicing into the ultraviolet light irradiation unit 52, thereby making it possible to cut the cost.

The present invention has been described with reference to the illustrated embodiment but the present invention is not limited thereto. That is, in the illustrated embodiment, the present invention is applied to a cutting machine having only one cutting means. When the present invention is applied to a cutting machine having two cutting means with a small installation space, the cutting machine can be provided with an ultraviolet light irradiation unit without increasing the size of the whole apparatus.

INDUSTRIAL UTILIZATION FEASIBILITY

Since the cassette placing unit of the cutting machine of the present invention is equipped with an ultraviolet light irradiation unit below the cassette table, an area for installing the ultraviolet light irradiation unit is not particularly needed. Therefore, the cutting machine of the present invention can be provided with the ultraviolet light irradiation unit without increasing the size of the whole apparatus. Since the cassette placing unit comprises an ascending/descending mechanism for positioning a cassette placed on the cassette table at a first workpiece carrying-in/carrying-out position which is located in the carrying-in/carrying-out area for the workpiece carrying-in/carrying-out means and the ultraviolet light irradiation unit at a second workpiece carrying-in/carrying-out position which is located in the carrying-in/carrying-out area for the workpiece carrying-in/carrying-out means, it is possible to use the workpiece carrying-in/ carrying-out means for carrying out the workpiece stored in the cassette and carrying the cut workpiece into the cassette as a carrying-in/carrying-out means for carrying in and out the cut workpiece to and from the ultraviolet light irradiation unit. Therefore, there is no need of providing a conveyance means for carrying the cut workpiece to the ultraviolet light irradiation unit, thereby making it possible to cut the cost.

What is claimed is:

1. A cutting machine equipped with a cassette placing unit having a cassette table for placing a cassette storing a workpiece supported to an annular support frame by an adhesive tape, a workpiece carrying-in/carrying-out means for carrying out a workpiece stored in the cassette placed on the cassette table and carrying a workpiece into the cassette, and a cutting means for cutting a workpiece carried out by the workpiece carrying-in/carrying-out means, wherein the cassette placing unit has an ultraviolet light irradiation unit, disposed below the cassette table, for storing a workpiece supported to the support frame by the adhesive tape and irradiating the adhesive tape with ultraviolet radiation, and an ascending/descending mechanism for positioning the cassette placed on the cassette table in the carrying-in/carrying-out area for the workpiece carrying-in/carrying-out means and for positioning the ultraviolet light irradiation unit in the carrying-in/carrying-out area for the workpiece carrying-in/carrying-out means.

2. The cutting machine of claim 1, wherein the cassette table forms the top wall of the housing of the ultraviolet light irradiation unit.

\* \* \* \* \*